(12) United States Patent
Richter (10) Patent No.: US 6,304,081 B1
(45) Date of Patent: Oct. 16, 2001

(54) SYSTEM AND METHOD FOR NON-DESTRUCTIVE MEASUREMENT OF DYNAMIC COERCIVITY EFFECTS

(75) Inventor: Hans Jürgen Richter, Palo Alto, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/179,297

(22) Filed: Oct. 27, 1998

Related U.S. Application Data (60) Provisional application No. 60/069,197, filed on Dec. 11, 1997.

(51) Int. Cl.[7] .................................................. G01R 33/12
(52) U.S. Cl. ............................ 324/210; 324/212; 360/25
(58) Field of Search .................................. 324/210–212; 360/25, 31, 53, 66; 369/53, 69

(56) References Cited

U.S. PATENT DOCUMENTS 4,847,558 * 7/1989 Fisher et al. ........................ 324/212

OTHER PUBLICATIONS

Aoi, H. et al., "Noise Characteristics In Longitudinal Thin-Film Media" *IEEE Transactions On Magnetics*, vol. MAG–22, No. 5, pp. 895–897 (Sep. 1986).

Bertram, H. et al., "DC Modulation Noise In Thin Metallic Media And Its Application For Head Efficiency Measurements", *IEEE Transactions On Magnetics*, vol. MAG–22, No. 4, pp. 247–252 (Jul. 1986).

Doyle, W. et al., "Reptation And Viscosity In Particulate Recording Media In The Time–Limited Switching Regime", *Journal Of Applied Physics*, vol. 75, No. 10, pp. 5547–5549 (May 15, 1994).

(List continued on next page.)

Primary Examiner—Jay Patidar
(74) Attorney, Agent, or Firm—Merchant & Gould P.C.

(57) ABSTRACT

A method for non-destructive measurement of dynamic coercivity is disclosed. In this method, magnetic media is DC erased by applying a forward DC magnetic field to the magnetic media such that the magnetic moments in the magnetic media are substantially aligned. A specified number of reversed magnetic field pulses are then applied to the magnetic media in a direction opposite to the forward DC magnetic field, wherein the intensity of the reversed magnetic field pulses is less than the remanent coercivity of the magnetic media. The broadband medium noise of the magnetic media is measured. The intensity of the reversed magnetic field pulses is then repeatedly and incrementally increased and applied to the write head for the specified number of pulses, the intensity of the reversed magnetic field pulses eventually exceeding the remanent coercivity of the magnetic media. For each intensity level of the reversed magnetic field pulses, the broadband medium noise is again measured. The coercivity of the magnetic media is derived from the reversed magnetic field pulse intensity at which the broadband medium noise is a maximum. The entire process may be repeated for different numbers of pulses in order to measure dynamic coercivity.

14 Claims, 5 Drawing Sheets

OTHER PUBLICATIONS

Richter, H. et al., "Dynamic Coercivity Effects In Thin Film Media", *Source Unknown*, 4 pgs. (Date Unknown).

Sharrock, M. et al., "Kinetic Effects in Coercivity Measurements", *IEEE Transactions On Magnetics*, vol. MAG–17, No. 6, 3 pgs. (Nov. 1981).

Gloria J. Tarnopolsky, Lung T. Tran, Alexander M. Barany, H. Neal Bertram and Darrel R. Bloomquist, *DC Modulation Noise and Demagnetizing Fields in Thin Metallic Media*, IEEE Transactions on Magnetics, vol. 25, No. 4, Jul. 1989, pp. 3160–3165.

M. El–Hilom K. O'Grady and R. W. Chantrell; *Reptation Effects in Particulate Systems. I. Theoretical Predictions*, Magnetic Recording Media—Particulate and Thin Film; Tom Arnoldussen, Chairman, J. Appl Phys. 73 (10), May 15, 1993, 1993 American Institute of Physics, pp. 6653–6655.

V. G. Lewis, P. I. Mayo and K. O'Grady, *Reptation Effects in Particulate Systems. II. Experimental Studies*, J. Appl. Phys. 73(10), May 15, 1993, ©1993 American Institute of Physics, pp. 6656–6658.

R. D. Fisher, J.L. Pressesky, *Spatially Resolved, In–Situ Measurements of the Coercive Force of Thin Film Magnetic Media*, IEEE Transactions on Magnetics, vol. 25, No. 5, Sep. 1989, pp. 3414–3416.

* cited by examiner

SYSTEM AND METHOD FOR NON-DESTRUCTIVE MEASUREMENT OF DYNAMIC COERCIVITY EFFECTS

CROSS-REFERENCE TO RELATED APPLICATIONS

Embodiments of this invention relate to Provisional Application Serial No. 60/069,197, filed Dec. 11, 1997. The contents of that application are incorporated by reference herein.

BACKGROUND OF THE INVENTION

1. Field of the Invention

Embodiments of this invention relate generally to the measurement of dynamic coercivity effects in magnetic media, and in particular embodiments to methods for non-destructive measurement of dynamic coercivity effects in magnetic media, and systems incorporating the same.

2. Description of Related Art

Modern computers require media in which digital data can be quickly stored and retrieved. Magnetizable (hard) layers on disks have proven to be a reliable media for fast and accurate data storage and retrieval. Disk drives that read data from and write data to hard disks have thus become popular components of computer systems.

As the recording media industry strives for increasingly smaller disk drives with increasingly larger storage capability, the areal density (the number of bits, or magnetic flux reversals, per inch) of magnetic disks continues to increase. In order to maintain a sufficient signal-to-noise ratio, the number of magnetizable units in each stored bit must be kept above a certain minimum value. To reduce bit size while maintaining a certain number of magnetizable units in each bit, the size of the magnetizable units (the particle or crystal grain size) must therefore be correspondingly decreased.

However, very small particles may be magnetically unstable due to the effect of thermal agitation (onset of superparamagnetism). Typically, an energy barrier inherent in a magnetized particle prevents the particle from reversing its magnetization, but as particle size decreases, this energy barrier also decreases. As the energy barrier becomes increasingly small, the likelihood that a particle will spontaneously reverse its magnetization due to thermal agitation over a given time period increases. This state, known as superparamagnetism, is characterized by low coercivity (the ability of a particle to resist magnetic change) and low remanent coercivity (the magnetic field required to reduce the magnetization of the particle to zero), and results in a particle with high magnetic instability.

Particle coercivity is also dynamic. Generally, particle coercivity is high when measured over short periods of time, but is low when measured over extended periods. Low coercivity over extended periods of time may cause the magnetic media to demagnetize. In addition, as the superparamagnetic regime is approached, the timedependence of coercivity increases. Thus, the related factors of small particle size, low coercivity, and the onset of superparamagnetism cause recorded bits to become unstable, increasing the likelihood that stored information will be lost.

The time-dependence of coercivity is particularly relevant to magnetic recording media because of the need to support both short-term writing capability and long-term data storage stability. An apparent solution to the problem of magnetic instability would be to utilize a magnetic material with a larger anisotropy constant to increase the "storage" or "long-term" coercivity until the desired stability of the magnetically stored information is achieved. However, this may also cause a significant increase in short-term coercivity and consequent writing difficulties. A balance between short-term and long-term particle coercivity must be achieved to produce both reliable data writing and stable data storage. The measurement of dynamic (time-dependent) coercivity effects in magnetic media is therefore an important capability in the design and development of magnetic recording media.

Conventional methods for measuring dynamic coercivity effects have employed destructive techniques for making the measurement. In these methods, test coupons or samples are separated from the magnetic media and placed in a test fixture for analysis by a magnetometer. For example, the article "Reptation effects in particulate systems. II. Experimental studies" by Lewis, et al., published in the Journal of Applied Physics, Vol. 73, No. 10, May 15, 1993, discusses the measurement of the time-dependence of coercivity using a sample of magnetic film and an alternating gradient force magnetometer (AGFM). In this approach, a sample must first be taken from the magnetic media and placed in a separate tester. The necessity of taking a sample physically destroys the magnetic media so that no further measurements can be made.

SUMMARY OF THE INVENTION

Therefore, it is an object of embodiments of the invention to provide a system and method for non-destructive measurement of dynamic coercivity effects in magnetic media such that subsequent measurements may be obtained from the magnetic media.

It is a further object of embodiments of the invention to provide a system and method for measurement of dynamic coercivity effects in magnetic media on a standard magnetic media parametric tester such as a spinstand tester so that separate testing devices such as magnetometers need not be used.

These and other objects are accomplished according to a method for non-destructive measurement of dynamic coercivity. In this method, magnetic media is DC erased by applying a forward DC magnetic field to the magnetic media such that the magnetic moments in the magnetic media are substantially aligned. A specified number of reversed magnetic field pulses are then applied to the magnetic media in a direction opposite to the forward DC magnetic field, wherein the intensity of the reversed magnetic field pulses is less than the remanent coercivity of the magnetic media. The broadband medium noise of the magnetic media is measured. The intensity of the reversed magnetic field pulses is then repeatedly and incrementally increased and applied to the write head for the specified number of pulses, the intensity of the reversed magnetic field pulses eventually exceeding the remanent coercivity of the magnetic media. For each intensity level of the reversed magnetic field pulses, the broadband medium noise is again measured. The coercivity of the magnetic media is derived from the reversed magnetic field pulse intensity at which the broadband medium noise is a maximum. The entire process may be repeated for different numbers of pulses in order to measure dynamic coercivity.

These and other objects, features, and advantages of embodiments of the invention will be apparent to those skilled in the art from the following detailed description of embodiments of the invention, when read with the drawings and appended claims.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

As the recording media industry strives for increasingly smaller disk drives with increasingly larger storage capability, the areal density (the number of bits, or magnetic flux reversals, per inch) of magnetic disks continues to increase. In order to maintain a sufficient signal-to-noise ratio, the number of magnetizable units in each stored bit must be kept above a certain minimum value. To reduce bit size while maintaining a certain number of magnetizable units in each bit, the size of the magnetizable units (the particle or crystal grain size) must therefore be correspondingly decreased.

However, very small magnetic particles are characterized by low coercivity (the ability of a particle to resist magnetic change) and low remanent coercivity (the magnetic field required to reduce the magnetization of the particle to zero), and as a result, tend to be magnetically unstable.

Particle coercivity, and hence magnetic stability, is also dynamic. Generally, particle coercivity is high when measured over short periods of time, but is low when measured over extended periods. A balance between short-term and long-term particle coercivity must be achieved to produce both reliable data writing and stable data storage. The measurement of dynamic (time-dependent) coercivity effects in magnetic media is therefore an important capability in the design and development of magnetic recording media.

Figure 1:
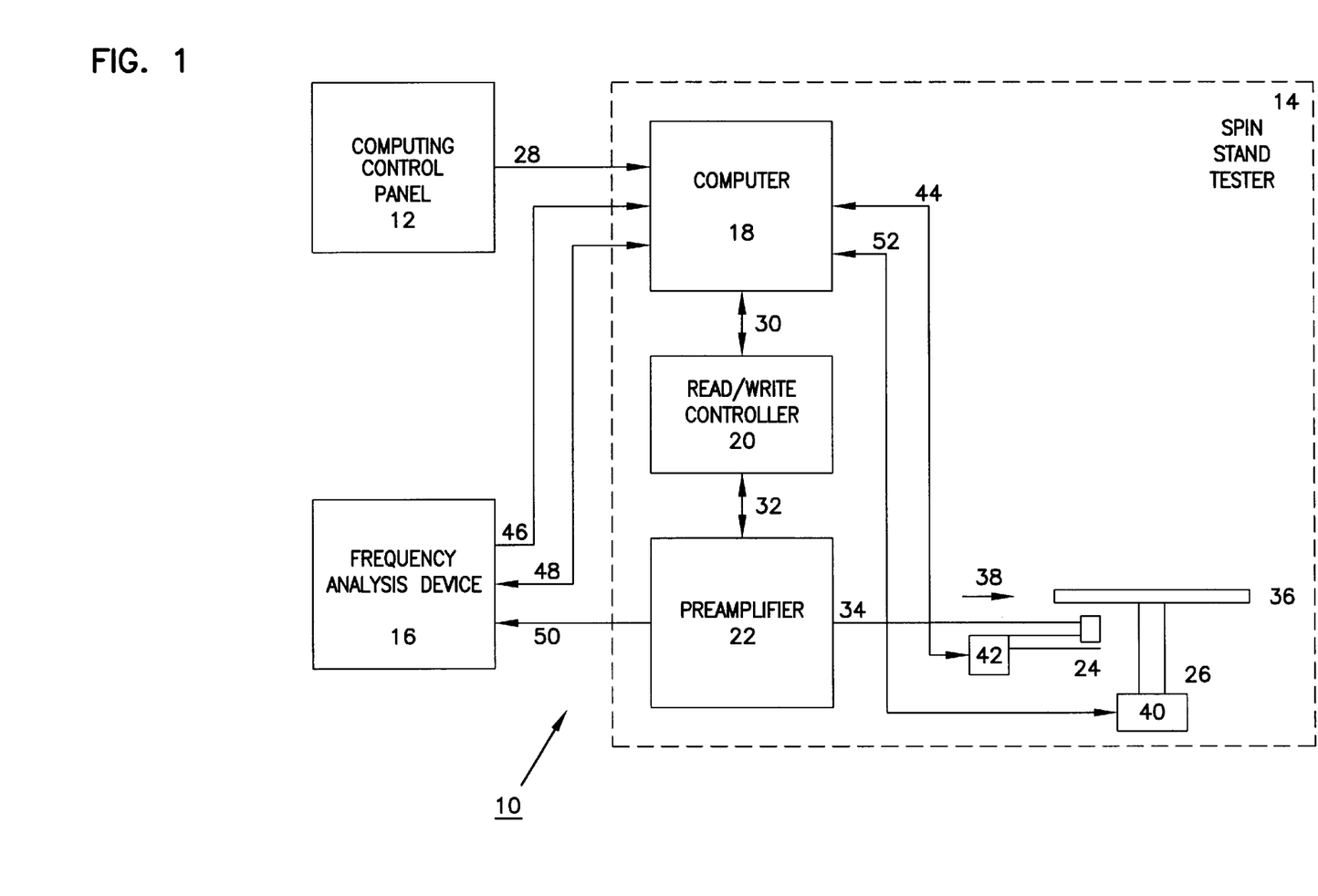
FIG. 1 is a schematic diagram of a system for nondestructive measurement of dynamic coercivity effects in magnetic media according to an embodiment of the present invention.

FIG. 1 illustrates an example of a coercivity measurement system 10 for use in measuring dynamic coercivity according to an embodiment of the invention. The coercivity measurement system 10 comprises a computer control panel 12, a spin stand tester 14, and a frequency analysis device 16. The spin stand tester 14 comprises a computer 18, a read/write controller 20, a preamplifier 22, a read/write head assembly 24, a head positioner 42 coupled to the read/write head assembly 24, a spindle motor 40, a spindle 26 rotatably coupled to the spindle motor 40, and a disk 36 coupled to the spindle 26.

An operator (not shown in FIG. 1) controls the coercivity measurement system 10 by entering commands into the computer control panel 12, which communicates with the spin stand tester 14 through computer control signals 28. Responsive to the computer control signals 28, the computer 18 communicates with the read/write controller 20 through read/write control signals 30, communicates with the head positioner 42 through head positioner control signals 44, communicates with the spindle motor 40 through spindle motor control signals 52, and communicates with the frequency analysis device 16 through frequency analysis device control signals 48. Responsive to the read/write control signals 30, the read/write controller 20 communicates with the preamplifier 22 through preamplifier control signals 32. Responsive to the preamplifier control signals 32, the preamplifier may source write current 38 to the read/write head assembly 24 through conductors 34, sense voltages from the read/write head assembly 24 across the conductors 34, or communicate with the frequency analysis device 16 through information signals 50. Responsive to the head positioner control signals 44, the head positioner 42 may move the read/write head assembly 24 radially with respect to the disk 36. Responsive to the spindle motor control signals 52, the spindle motor 40 may rotate the disk 36 at a variable number of revolutions per minute (RPM). Responsive to frequency analysis device control signals 48, the frequency analysis device 16 may communicate data to the computer 18 through frequency analysis device data signals 46.

To measure dynamic coercivity, an operator uses the computer control panel 12 to initiate a program stored in computer 18. In alternative embodiments of the invention, the program may be stored in hardware, software, or firmware of the computer 18 or a peripheral (not shown in FIG. 1).

The idea of the measurement technique is to use the reverse DC erased noise (broadband medium noise) as an indicator for coercivity. After magnetizing a band of overlapping tracks in one direction such that a substantial number of magnetic moments are aligned, a DC magnetic field in the reverse direction is applied for a specified number of pulses. The broadband medium noise is then derived from a signal read from the magnetic media. As a function of the write current applied in the reverse direction and the number of applied magnetic field pulses, the broadband medium noise of the overwritten tracks is at a maximum where the applied DC magnetic field in the reverse direction is equivalent to the coercivity of the magnetic media.

Figure 2:
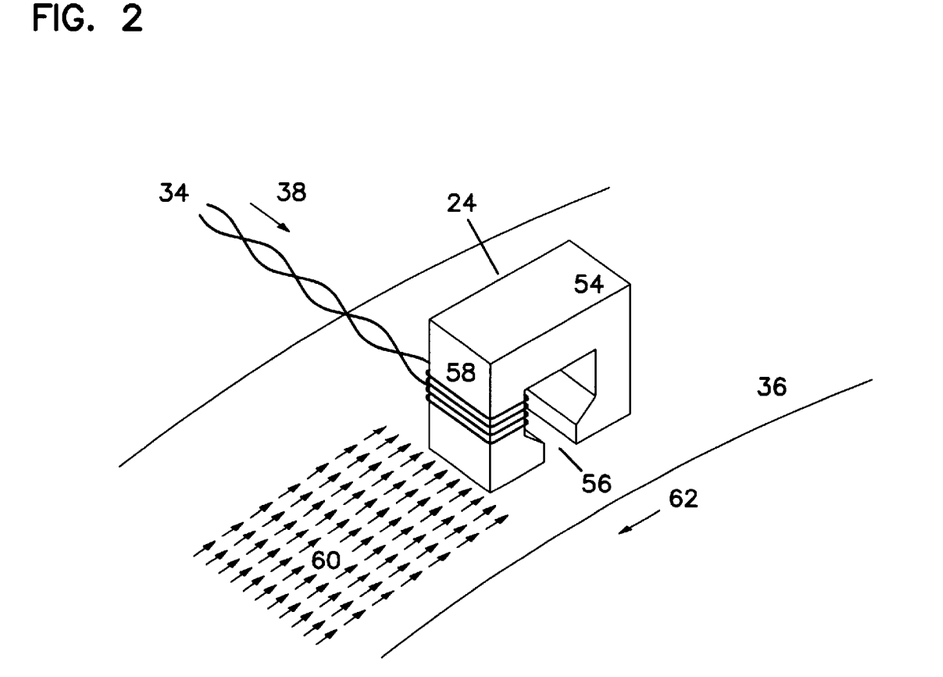
FIG. 2 illustrates the DC erasing of a track according to an embodiment of the invention.

As illustrated in FIG. 2, the program may first cause a DC-erase to be performed such that all magnetic moments in the test area of the disk 36 are oriented in the same direction. To accomplish this, under program control the preamplifier 22 (see FIG. 1) sources a constant write current 38 through a plurality of conductors 34 and into the read/write head assembly 24. The read/write head assembly 24 includes a core 54 shaped to form a gap 56, and a coil 58 wrapped about the core 54 and coupled to the conductors 34. The constant write current 38 flowing through the coil 58 induces a constant magnetic flux (not shown in FIG. 2) to form in the core 54 and fringe across the gap 56, orienting substantially all magnetic moments under the gap 56 in the same direction and creating a track of DC-erased magnetic moments 60 as the disk 36 under test spins in the direction indicated by the arrow 62. The program then directs the head positioner 42 (see FIG. 1) to radially reposition the read/write head assembly 24 over adjacent areas of the disk 36, and the erase process is repeated until a sufficiently wide area of the disk 36 has been DC-erased. In alternative embodiments of the present invention, the magnetic media need not be rotatable, and may be DC-erased by simply sourcing constant write current 38 through a plurality of conductors 34 and into a read/write head assembly 24 positioned over stationary magnetic media, or by positioning a permanent magnet over the magnetic media.

Figure 3:
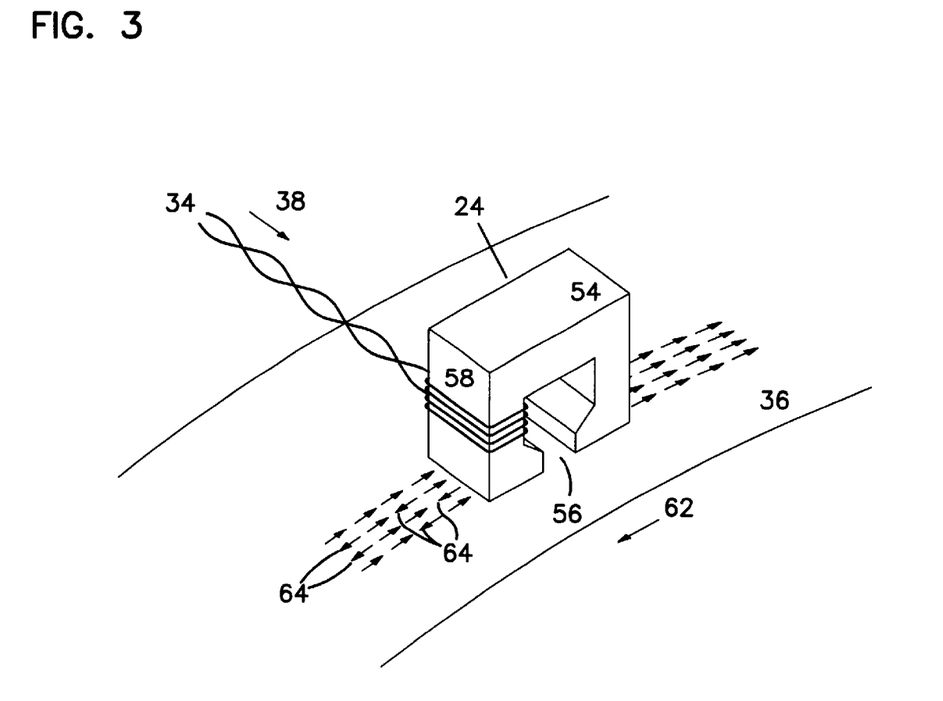
FIG. 3 illustrates partial reverse DC erasing of a track according to an embodiment of the invention.

Next, as illustrated in FIG. 3, the program causes the reverse DC-erasing of the disk 36 such that some of the magnetic moments reverse their direction. The process to accomplish this is very similar to the process for DC-erasing, except that the direction of the write current 38 is reversed. By reversing the direction of the write current 38 as the disk 36 spins in the direction indicated by the arrow 62, the disk 36 is subjected to reversed magnetic field pulses oriented opposite to the DC-erased magnetic moments, and reversed orientation magnetic moments 64 may appear, overwriting the homogeneous orientation of DC-erased magnetic moments 60. The number of reversed orientation magnetic moments 64 is dependent on the magnitude of the reversed write current 38 (and hence the intensity of the reversed magnetic field pulses)—the higher the current, the more reversed orientation magnetic moments 64 will appear. For example, if the reversed write current 38 produces reversed magnetic field pulses with an intensity well in excess of the coercivity of the magnetic media, a substantial number of magnetic moments will be reversed. If the reversed magnetic field pulse intensity is substantially below the coercivity of the magnetic media, few magnetic moments will be reversed. If the reversed magnetic field pulse intensity approaches the coercivity of the magnetic disk 36, each time the read/write head assembly 24 passes over a particular area on the disk 36, more reversed orientation magnetic moments 64 will appear in that area of the disk 36.

Figure 4:
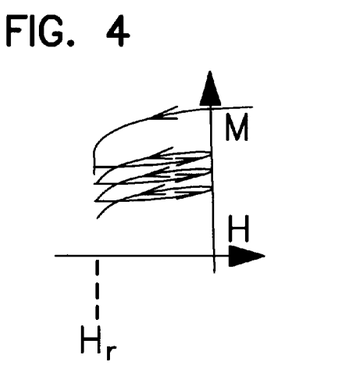
FIG. 4 is a symbolic representation of reptation according to an embodiment of the invention.

The duration of the reversed magnetic field pulse is approximately given by $t_p \approx g/v$, where g is the gap length 56 and v is the linear velocity of the disk 36 as it spins in the direction 62. Pulse duration can be varied by changing the linear velocity or changing the gap length. Another way to change the effective pulse duration is to subject the magnetic media to many of these field pulses rather than to one. In that case, $t_{p,n} = n*t_{p,l} \approx n*g/v$, where n is the number of passes of the read/write head assembly 24. As illustrated in FIG. 4, where M is the intensity of magnetization of the magnetic media and H is the applied magnetic field intensity, the application of several field pulses results in cycling through minor loops, each loop cycling between no applied magnetic field (H=0) and an applied magnetic field at approximately the remanent coercivity of the material ($H_r$). The process sketched in FIG. 4 is called "reptation." The repeated application of n pulses can be approximated as one pulse of correspondingly longer duration, which allows time-dependent measurement of the magnetic material's coercivity. In preferred embodiments of the present invention, the linear velocity is approximately 45 m/s (a large radius disk 36 spinning at approximately 10000 RPM), which results in a pulse length of about 10 ns, and the read/write head assembly 24 has a gap 56 of 500 nm and is operated at zero skew.

It should be noted that although in preferred embodiments of the present invention reptation is typically achieved by rotating magnetic media past a DC magnetic field, in alternative embodiments a pulsed magnetic field on stationary magnetic media may also be used.

Figure 5:
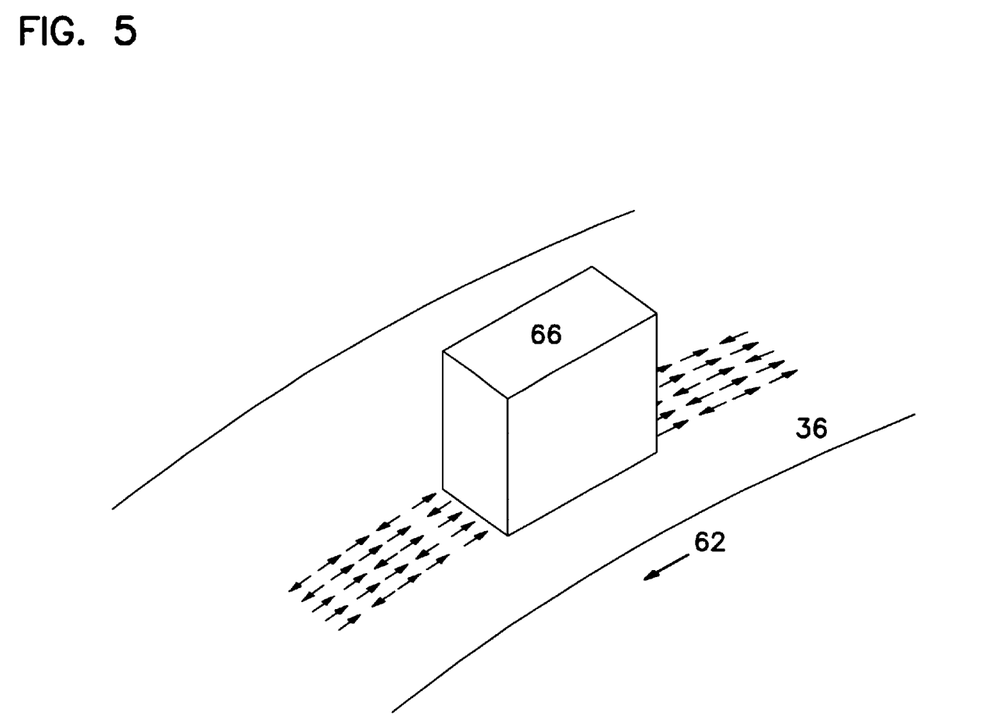
FIG. 5 illustrates the reading of an information signal from a partially reverse DC-erased track using a magnetoresistive read head according to an embodiment of the invention.

The coercivity is measured by reading and deriving the broadband medium noise from the magnetic media after a specified number of disk rotations or pulses have been applied. Referring to FIG. 5, to read and compute the broadband medium noise, a read head is positioned over the reverse DC-erased area of the disk 36 by the head positioner 42 (see FIG. 1) under program control. In preferred embodiments of the invention, the read/write head assembly 24 includes a magneto-resistive (MR) read head 66. The MR read head 66 is comprised of a conductive element whose resistivity varies as a function of an applied magnetic field. In an MR head, a constant current is sourced through the element and a bias magnetic field is applied in an orientation approximately 45° from the direction of the current, and as the head is placed in close proximity with magnetized areas on the disk 36, the applied magnetic field from the magnetic moments on the disk 36 causes the resistance of the element, and hence the voltage across it, to change. If the net magnetic field (the bias magnetic field plus the applied magnetic field from the disk 36) is oriented parallel to the current, the resistance and voltage across the element increases. If the net magnetic field is oriented perpendicular to the current flow, the resistance and voltage across the element decreases. Thus, by sensing the voltage across the element, stored data in the form of oriented magnetic moments can be read. In alternative embodiments of the invention, the core 54 of the read/write head assembly 24 (see FIG. 2) also serves as the read head. In such embodiments, magnetic fields from the magnetic moments form in the core, and a voltage is induced in the coil 58. Again, by sensing the voltage across the coil, stored data in the form of oriented magnetic moments can be read.

Referring again to FIG. 5, when the MR head 66, under program control, is positioned over a partially reverse DC-erased area on the disk 36, the MR head 66 senses a voltage and communicates this voltage to the preamplifier 22 through conductors 34 (see FIG. 1). The preamplifier 22 transforms the voltage reading into an information signal 50, and communicates the information signal 50 to the frequency analysis device 16. The frequency analysis device 16 performs a Fourier transform on the information signal 50 and computes and stores the resultant Fourier spectrum. It should be noted that in alternative embodiments of the invention, the frequency analysis device 16 may be any device, system, or analog filter that can perform a Fourier transform or a fast Fourier transform on the information signal 50 or derive all or part of the frequency spectrum from the information signal 50. The data points comprising the frequency spectrum are then communicated to the computer 18 through frequency analysis device data signals 46.

The resultant data points represent the noise power spectrum. A broadband media noise calculation is then made by integrating the noise power spectrum over a predetermined frequency range. In preferred embodiments of the present invention, the noise is integrated between 5 and 160 kfci, and the electronic and head noise is removed before the integration. Measurements have confirmed that the peak of the noise occurs at the coercivity of the magnetic material (see "DC Modulation Noise and Demagnetizing Fields in Thin Metallic Media" by Tarnopolsky et al., published in IEEE Transactions in Magnetics, Vol. 25, No. 4, July 1989, incorporated herein by reference).

It should be noted that the interpretation of measured data must be viewed with caution, because there is a demagnetization field associated with the pseudo-transition occurring when the reversed direction magnetic field switches the medium magnetization from the saturated remanent state to M=0. This demagnetization field emanating from the magnetic media shields the reversed direction magnetic field such that the actual magnetic field seen by the medium is somewhat lower than the applied reversed direction magnetic field itself. Compensation for the demagnetizing field is discussed in "Modulation Noise and Demagnetizing Fields in Thin Metallic Media" by Tarnopolsky, et al., published in IEEE Transactions on Magnetics, Vol. 25, No. 4, July 1989, and is incorporated herein by reference.

Figure 6:
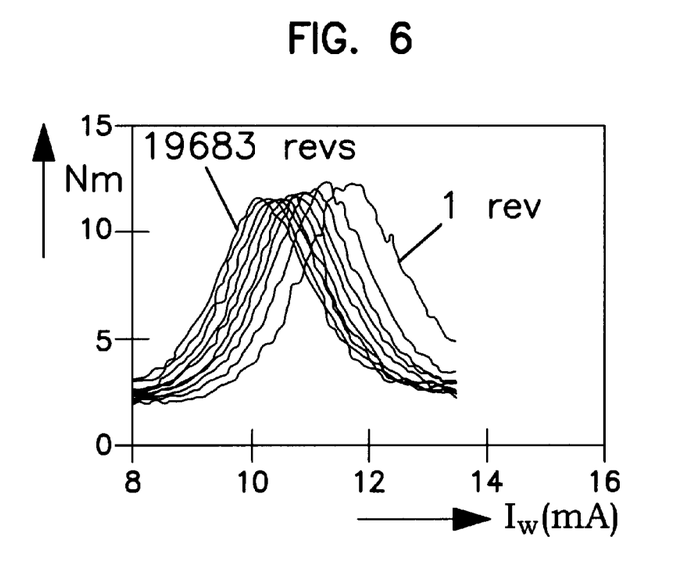
FIG. 6 is graph of reverse DC erase noise voltage curves versus write current for differing numbers of media rotations according to an embodiment of the invention.

The basic steps of DC erasing an area on magnetic media, applying a reversed DC current (and hence a reversed magnetic field) for a specified number of rotations or pulses, and measuring the broadband medium noise, is repeated for various currents and various rotations or pulses. As illustrated in FIG. 6, a family of curves of write current ($I_w$) versus broadband media noise (Nm) in arbitrary units (a.u.) may be obtained for different numbers of revolutions or pulses. The number of pulses in FIG. 6 was increased according to the formula $3^m$, where m varied from zero to nine. However, in alternative embodiments of the present invention, any number of pulses may be utilized to characterize the dynamic coercivity of the magnetic media under test. Note that as the effective pulse width of the reversed magnetic field increases (increased number of rotations), the write current (and hence the applied reverse magnetic field) at which the broadband media noise is at a maximum decreases. Because the applied reverse magnetic field that maximizes media noise is approximately equivalent to the coercivity of the magnetic media, FIG. 6 illustrates the dynamic or time-dependent nature of coercivity, wherein coercivity decreases as the duration of an applied magnetic field pulse increases.

Figure 7:
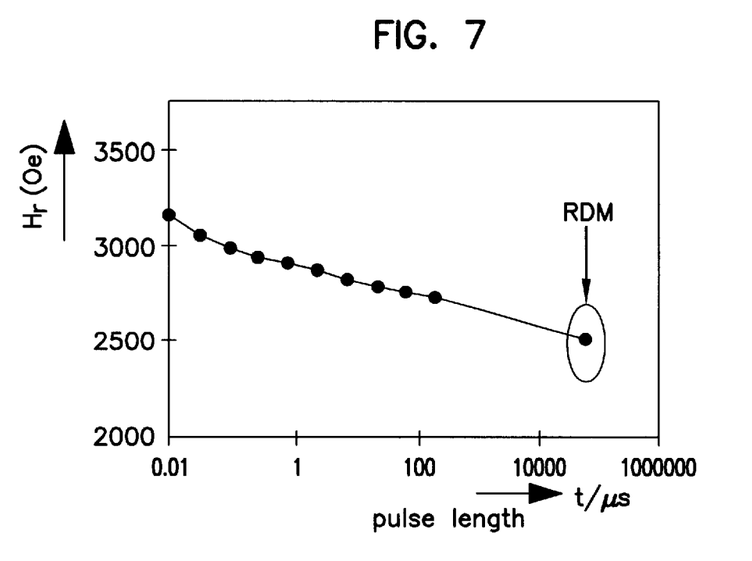
FIG. 7 is a graph of remanent coercivity versus reverse magnetic field pulsewidth according to an embodiment of the invention.

Because the write current is proportional to the applied magnetic field, the currents can be converted back to magnetic fields. The currents can be calibrated by measuring the coercivity with a non-destructive rotating disk magnetometer (RDM). The conversion process is described in "Spatially resolved, in-situ measurements of the coercive force of thin film media" by R. D. Fisher and J. P. Pressesky, published in IEEE Transactions on Magnetics, Vol. 25, pp. 5547–49, May 1994, and is incorporated herein by reference. The result of this conversion is shown in FIG. 7, where Hr is the remanent coercivity in Oerstads (Oe). FIG. 7 again confirms that coercivity decreases as the duration of an applied magnetic field pulse increases.

Figure 8:
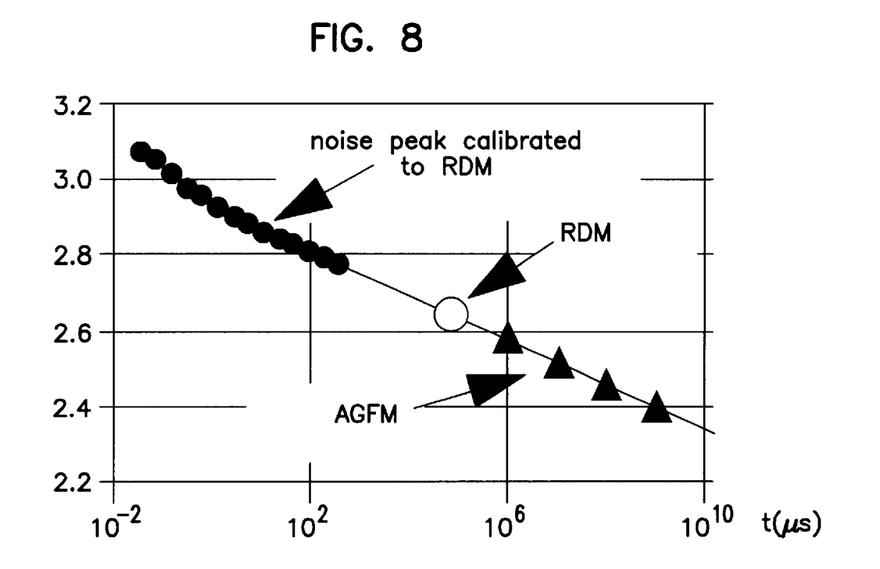
FIG. 8 is a graph showing a comparision of remanent coercivity versus reverse magnetic field pulsewidth obtained from a rotating disk magnetometer (RDM), an AGFM, and an embodiment of the invention.

FIG. 8 compares remanent coercivity versus reversed magnetic field pulsewidth data for embodiments of the present invention (black circles), a rotating disk magnetometer (white circle), and an AGFM (triangles). For the AGFM measurement, the demagnetizing field for each field point was applied for 0.1, 1, 10, 100, and 1000 seconds, respectively, and a very large sweep rate was utilized. FIG. 8 also shows that the range in which coercivity changes logarithmically with time is very large, with a slight deviation for very short times.

Therefore, according to the foregoing description, preferred embodiments of the present invention provide a system and method for non-destructive measurement of dynamic coercivity effects in magnetic media such that subsequent measurements may be made on the magnetic media. The system and method works in conjunction with standard magnetic media parametric testers such as spinstand testers so that separate testing devices such as magnetometers need not be used.

The foregoing description of preferred embodiments of the invention has been presented for the purposes of illustration and description. It is not intended to be exhaustive or to limit the invention to the precise form disclosed. It is intended that the scope of the invention be limited not by this detailed description, but rather by the claims appended hereto.

What is claimed is:

1. A method for non-destructive measurement of dynamic coercivity of magnetic media, the magnetic media initially having a substantial number of aligned magnetic moments, the method comprising the steps of:

applying a first number of reversed magnetic field pulses at a fixed magnetic field intensity to the magnetic media and measuring broadband medium noise of the magnetic media for each of a number of incrementally increasing magnetic field intensities;

deriving the coercivity of the magnetic media from the magnetic field intensity at which the broadband medium noise is approximately at a maximum; and repeating the above steps while varying the first number of reversed magnetic field pulses.

2. The method of claim 1, wherein the reversed magnetic field pulses are oriented in a direction opposite to the aligned magnetic moments in the magnetic media.

3. The method of claim 1, wherein in the step of applying a first number of reversed magnetic field pulses at a fixed magnetic field intensity to the magnetic media and measuring broadband medium noise of the magnetic media for each of a number of incrementally increasing magnetic field intensities, the magnetic field intensity is incrementally increased from a level less that the coercivity of the magnetic media to a level greater than or approximately equal to the coercivity of the magnetic media.

4. The method of claim 1, wherein the step of measuring broadband medium noise comprises the step of storing a media noise data point representing an integration of a noise power spectrum obtained from a Fourier spectrum of an information signal read from the magnetic media.

5. The method of claim 4, wherein the step of storing a media noise data point representing an integration of a noise power spectrum obtained from a Fourier spectrum of an information signal read from the magnetic media comprises the steps of:

performing a Fourier transform on the information signal to generate frequency spectrum data points representing the Fourier spectrum of the information signal, the frequency spectrum data points comprising a noise power spectrum;

integrating the noise power spectrum over a predetermined frequency range to compute a media noise level; and storing a media noise data point representing the media noise level.

6. The method of claim 1, wherein the coercivity of the magnetic media can be approximated as equivalent to the magnetic field pulse intensity at which the measured broadband medium noise is approximately at a maximum.

7. The method of claim 1, wherein preceding the step of applying a first number of reversed magnetic field pulses at a fixed magnetic field intensity to the magnetic media and measuring broadband medium noise of the magnetic media for each of a number of incrementally increasing magnetic field intensities, the magnetic moments in the magnetic media are substantially aligned by flowing DC write current through a write head positioned over the magnetic media.

8. The method of claim 1, wherein reversed magnetic field pulses are applied to the magnetic media by reptation.

9. A system for non-destructive measurement of dynamic coercivity of magnetic media initially having a substantial number of aligned magnetic moments, the system comprising:

- a write head for applying a first number of reversed magnetic field pulses at a first magnetic field intensity to the magnetic media for each of a number of incrementally increasing first magnetic field intensities;
- a read head for reading an information signal from the magnetic media after each application of the first number of reversed magnetic field pulses;
- a frequency analysis device responsive to the information signal from the read head for generating a Fourier spectrum from the information signal read from the magnetic media after each application of the first number of reversed magnetic field pulses; and
- a computing device in communication with the frequency analysis device for computing a broadband medium noise value from the Fourier spectrum generated after each application of the first number of reversed magnetic field pulses, and determining coercivity of the magnetic media as a function of the first number of reversed magnetic field pulses by locating the first magnetic field intensity at which the broadband medium noise value is approximately at a maximum;
- wherein the dynamic coercivity of the magnetic media may be observed by varying the first number of reversed magnetic field pulses and determining the coercivity of the magnetic media as a function of the first number of reversed magnetic field pulses.

10. The system of claim 9, wherein the write head further includes write current flowing through a coil wrapped about a core for applying the reversed magnetic field pulses in a orientation opposite to the substantially aligned magnetic moments in the magnetic media.

11. The system of claim 9, wherein the read head comprises a magneto-resistive (MR) read head.

12. The system of claim 9, wherein the write head further includes variable write current flowing through a coil wrapped about a core for incrementally increasing the first magnetic field intensity from a level less than the coercivity of the magnetic media to a level greater than or approximately equal to the coercivity of the magnetic media.

13. The system of claim 9, wherein the write head further includes write current flowing through a coil wrapped about a core for initially substantially aligning the magnetic moments in the magnetic media by applying a forward DC magnetic field in an orientation opposite to that of the reversed magnetic field pulses.

14. The system of claim 9, further including:

- a spindle couplable to the magnetic media;
- a spindle motor responsive to control signals from the computing device and coupled to the spindle for rotating the spindle; and
- write current flowing through a coil wrapped about a core for applying reversed magnetic field pulses to the magnetic media by applying a DC write current to the write head while the magnetic media and spindle are rotating.

* * * * *

UNITED STATES PATENT AND TRADEMARK OFFICE
CERTIFICATE OF CORRECTION

PATENT NO. : 6,304,081 B1
DATED : October 16, 2001
INVENTOR(S) : Richter

It is certified that error appears in the above-identified patent and that said Letters Patent is hereby corrected as shown below:

Column 8,
Line 39, "less that the" should read -- less than the --

Signed and Sealed this

Twenty-first Day of May, 2002

Attest:

Attesting Officer

JAMES E. ROGAN
Director of the United States Patent and Trademark Office